US006724014B2

(12) United States Patent
Medale et al.

(10) Patent No.: US 6,724,014 B2
(45) Date of Patent: Apr. 20, 2004

(54) HIGH-VOLTAGE HYBRID CIRCUIT

(75) Inventors: Jean-Louis Medale, Vigoulet (FR); Claude Aoustin, Toulouse (FR); Jacques Coutelier, Escalquens (FR); Pierre Souleille, Escalquens (FR)

(73) Assignee: Centre National de la Recherche Scientifique C.N.R.S. (FR)

( * ) Notice: Subject to any disclaimer, the term of this patent is extended or adjusted under 35 U.S.C. 154(b) by 0 days.

(21) Appl. No.: 10/155,254

(22) Filed: May 24, 2002

(65) Prior Publication Data

US 2002/0179917 A1 Dec. 5, 2002

Related U.S. Application Data

(63) Continuation of application No. PCT/FR00/03290, filed on Nov. 24, 2000.

(30) Foreign Application Priority Data

Nov. 26, 1999 (FR) .............................. 99/14934

(51) Int. Cl.[7] .............................................. H01L 33/00
(52) U.S. Cl. ........................ 257/98; 257/99; 257/100; 361/228; 361/235; 361/117; 361/107
(58) Field of Search ............................ 257/98, 99, 100; 361/228, 235, 117, 107

(56) References Cited

U.S. PATENT DOCUMENTS

| 3,652,859 | A | | 3/1972 | Toussaint |
| 5,545,893 | A | | 8/1996 | Brown et al. |
| 5,684,666 | A | * | 11/1997 | Noakes et al. ............... 361/228 |
| 6,373,203 | B1 | * | 4/2002 | Goseberg et al. ........... 315/411 |

FOREIGN PATENT DOCUMENTS

| EP | 0 646 973 A1 | 4/1995 |
| WO | WO 96/08857 | 3/1996 |

OTHER PUBLICATIONS

Frank Goodenough, *Innovative Circuits Create ±20–MA ±20KV IC OP AMP*, Electronic Design, vol. 41, No. 2, Jan. 21, 1993, p. 31–32.

* cited by examiner

*Primary Examiner*—Nathan J. Flynn
*Assistant Examiner*—Fazli Erdem
(74) *Attorney, Agent, or Firm*—Piper Rudnick LLP

(57) ABSTRACT

A hybrid semiconductor circuit adjustable by a control current for controlling voltage comprising a single high-voltage reversely polarized diode surrounded by at least two diodes emitting infrared radiation fed in series by the control signal and arranged to allow optical interaction with the high-voltage diode, wherein the diodes are encapsulated with a coating resin having a high transmission rate in an infrared domain.

8 Claims, 4 Drawing Sheets

HIGH-VOLTAGE HYBRID CIRCUIT

RELATED APPLICATION

This is a continuation of International Application No. PCT/FR00/03290, with an international filing date of Nov. 24, 2000, which is based on French Patent Application No. FR 99/14934, filed Nov. 26, 1999.

FIELD OF THE INVENTION

This invention relates to the field of high-voltage, low-power electronic circuits, more particularly, amplification circuits and programmable-feed circuits.

BACKGROUND

Known in the state of the art are high-voltage control devices employing electron tubes. Such devices require considerable heating forces for heating the filaments. They are also relatively large and bulky.

Low-voltage optical coupler circuits are also known in the state of the art.

EP 646973 concerns an integrated low-voltage optical coupler designed to create electric separation between an input signal and an output signal.

WO 06/08857 also pertains to a low-voltage optical coupler having an improved signal-noise ratio.

FR 2,569,978 concerns an optoelectronic receiver for fiber-optic transmission.

The article "INNOVATIVE CIRCUITS CREATE 20-MA 20 KV IC OP AMP" published in ELECTRONIC DESIGN, Jan. 21, 1993, describes an optical coupler employing multiple stages connected in series, with each stage comprising a low-voltage diode coupled optically to a single emitting diode. Such a device has excessive bulk for certain applications.

It would accordingly be advantageous to resolve these drawbacks and provide a miniaturized circuit capable of operation at voltages higher than 6000 volts.

SUMMARY OF THE INVENTION

This invention relates to a hybrid semiconductor circuit adjustable by a control current for controlling voltage comprising a single high-voltage reversely polarized diode surrounded by at least two diodes emitting infrared radiation fed in series by the control signal and arranged to allow optical interaction with the high-voltage diode, wherein the diodes are encapsulated with a coating resin having a high transmission rate in an infrared domain.

This invention also relates to a high-voltage amplifier comprising at least one hybrid circuit as set forth above and controlled by an input signal feeding the at least two diodes and delivering an output signal controlled by the high-voltage diode fed by a reverse current.

This invention further relates to a high-voltage adjustable feed comprising at least one hybrid circuit as set forth above and controlled by an adjustable signal feeding the t least two diodes and delivering an output signal controlled by the high-voltage diode fed by a reverse current.

BRIEF DESCRIPTION OF THE DRAWINGS

Better comprehension of the invention will be attained by reading the description below with reference to a nonlimitative example of implementation and to the attached figures in which.

DETAILED DESCRIPTION

Figure 1:
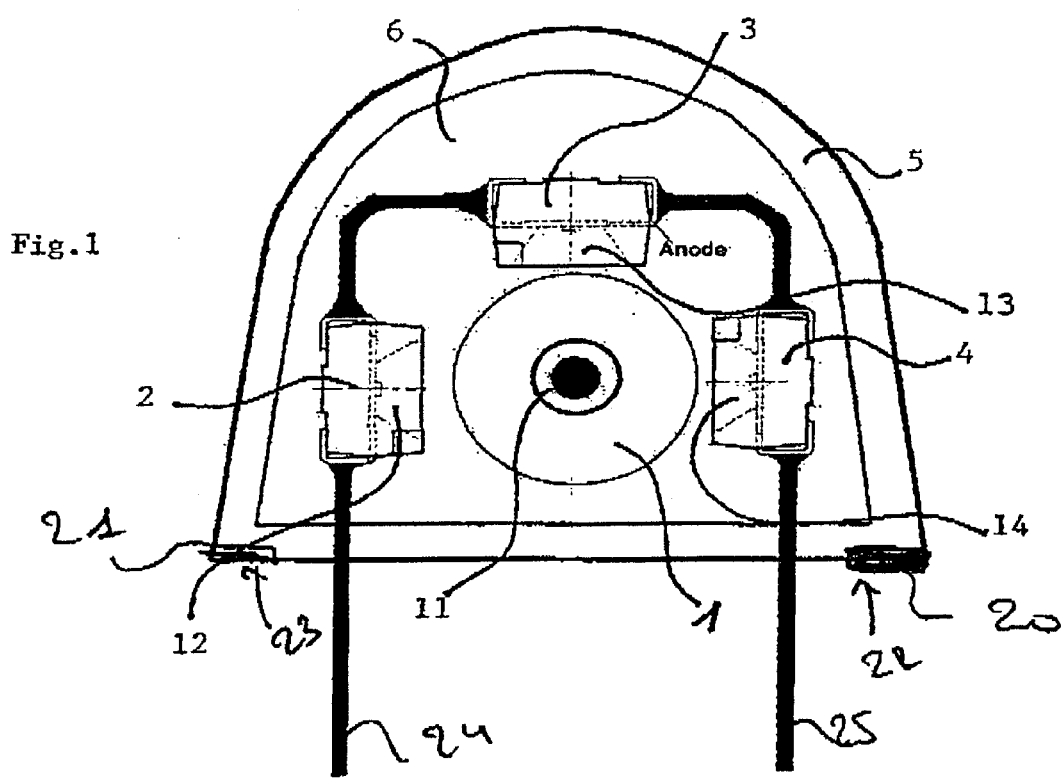
FIG. 1 is a sectional view of an optical coupler according to aspects of the invention.

It will be appreciated that the following description is intended to refer to specific embodiments of the invention selected for illustration in the drawings and is not intended to define or limit the invention, other than in the appended claims.

The invention concerns in its broadest sense a hybrid semiconductor circuit adjustable by a control current for controlling high voltages comprising at least a single high-voltage reversely polarized diode surrounded by at least two diodes emitting infrared radiation fed by the control current and arranged to allow optical interaction with the high-voltage diode, the diodes being integrated in a housing filled with an insulating encapsulation resin having a high transmission rate in the infrared domain. The encapsulation resin is selected from among the resins having an optical index substantially identical to that of the material used for the diodes. The resin is coated by a material which is opaque in the infrared domain.

The adjustable infrared diodes are advantageously arranged transversely, with an emission axis that is radial in relation to the principal axis of the high-voltage diode.

According to one advantageous mode of implementation, the high-voltage diode and the infrared diodes are arranged in a housing made of a material which is reflective in the infrared domain, the housing being filled with an epoxide resin.

The infrared electroluminescent diodes preferably emit a radiation of about 880 nanometers.

According to a preferred mode of implementation, the infrared electroluminescent diodes are connected in series.

The housing is advantageously made of epoxide resin charged with a material based on titanium oxide or other materials that have reflective properties in the infrared domain.

The invention also concerns a high-voltage amplifier including at least one hybrid circuit conforming to the invention, controlled by an input signal feeding the infrared electroluminescent diodes and delivering an output signal controlled by the high-voltage diode fed by a reverse current.

The invention also concerns a programmable high-voltage feed including at least one hybrid circuit conforming to the invention, controlled by an adjustable signal feeding the infrared electroluminescent diodes and delivering an output signal controlled by the high-voltage diode fed by a reverse current.

Turning now to the drawings in general and FIG. 1 in particular, there is shown a sectional view of an optical coupler according to a nonlimitative example of the invention. The device comprises a high-voltage diode (1) surrounded by three electroluminescent diodes (2, 3 and 4). These diodes are implemented in series and are controlled by a control signal having an amplitude of 5 volts. The diodes (1 to 4) are coated by a resin of the epoxide, epoxy or polyurethane type.

According to a first variant, the diodes are arranged in a housing (5), which is reflective in the operating band of the diodes. The housing is made of a material based, most preferably, on titanium oxide.

The interior space of this housing is filled with an epoxide resin (6) providing for electrical insulation and optical coupling. The epoxide resin is selected to have an optical index substantially identical to that of the diodes.

According to another aspect, the diodes are molded in a resin coated by paint or coating with a resin comprising charges that are reflective in the infrared domain:

titanium zincate, titanium oxide and the like.

Two elements (20, 21) having bottom surfaces (22, 23) are molded in the resin (6) to form a reference plane at the side of the connection junctions (24, 25).

The diode (1) is a high-voltage diode of generally cylindrical form. It can be, for example, a diode marketed by SEMTECH as reference no. SM40, SM50, SM75 or SM100, the opaque coating of which has been removed to enable sensitivity to the infrared radiation.

This diode (1) is surrounded by three electroluminescent diodes (2 to 4), for example, diodes marketed by SIEMENS as reference no. SFH421 or SFH426. These diodes have a window whose normal (12 to 14) is oriented radially in relation to the longitudinal axis (11) of the high-voltage diode (1).

Figure 2:
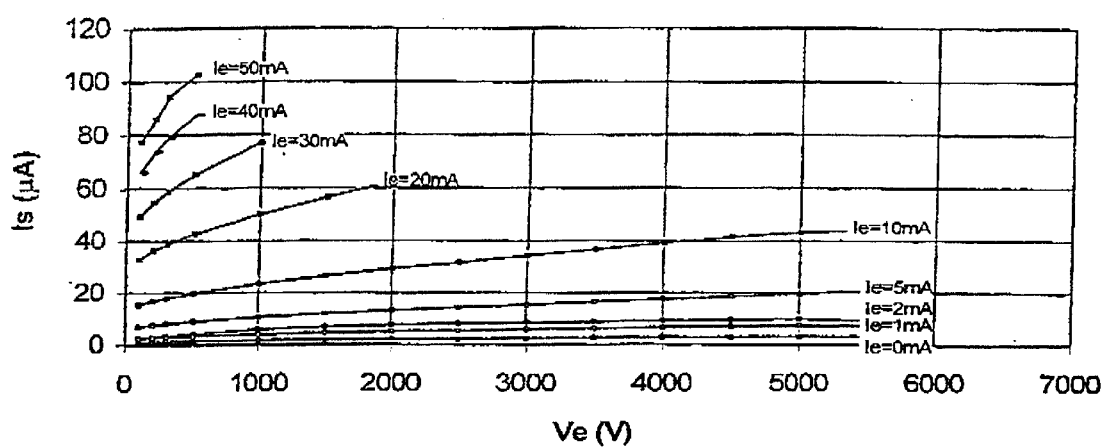
FIG. 2 is a graph showing the response curve of the high-voltage diode.

The infrared light emitted by the diodes (2 to 4) leads to an increase in the reverse current of the high-voltage diode (1). The reverse current varies between about several nanoamperes in the absence of infrared emission and about several hundred microamperes when the diodes (2 to 4) carry a control current and emit infrared radiation. The diode (1), thus, acts like a variable resistance, the curve of which is shown in FIG. 2.

Figure 3:
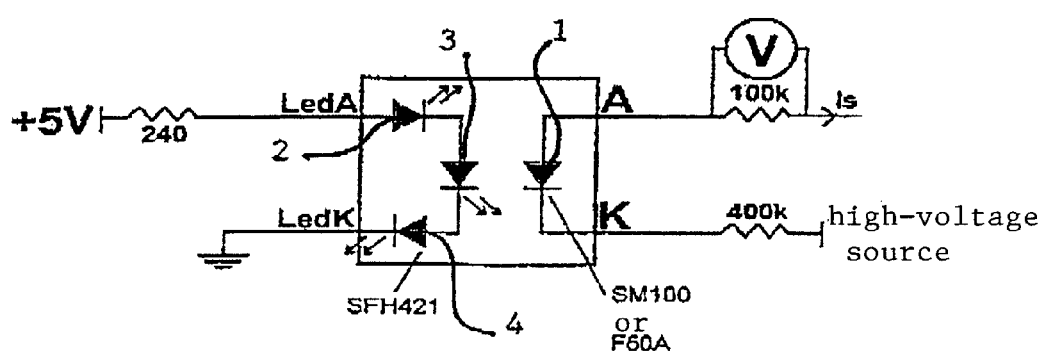
FIG. 3 is a schematic view of such an optical coupler.

FIG. 3 is a general diagram of an amplifier device using such a circuit. The detection diodes (2 to 4) are connected in series. The emission diode (1) is polarized in reverse direction. The blockage voltage of such a hybrid device exceeds about 10,000 volts.

Figure 4:
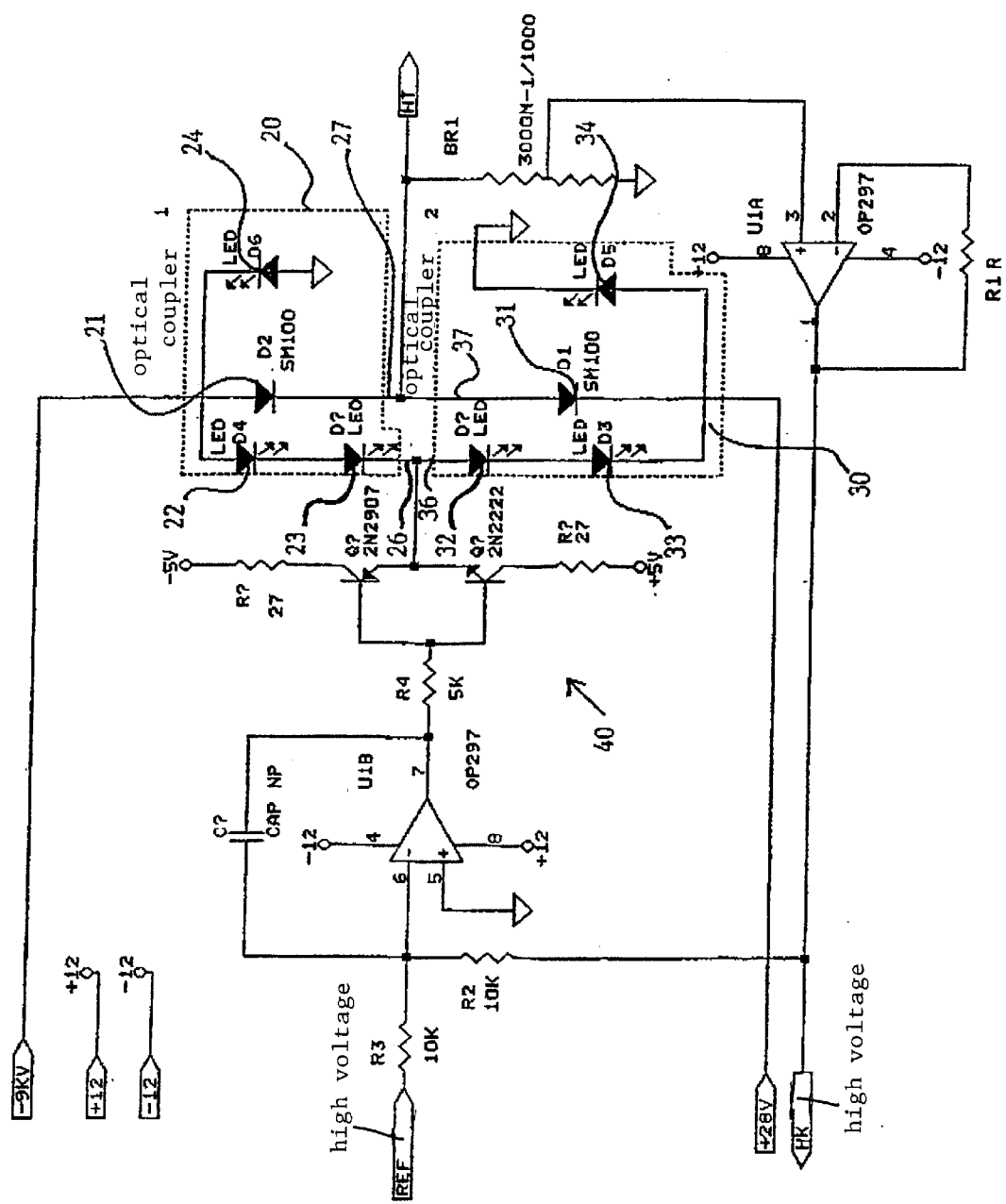
FIG. 4 is a general diagram of a high-voltage amplifier.

FIG. 4 is a general diagram of a high-voltage programmable feed employing two hybrid circuits (20, 30) conforming to aspects of the invention. Each of the hybrid circuits comprises one high-voltage diode (21) and (31), respectively, surrounded by three electroluminescent diodes (22 to 24) and (32 to 34), respectively. The two hybrid circuits (20, 30) are controlled by a control signal delivered by a circuit (40). The inputs (26, 36) are connected in series as are the outputs (27, 37).

The invention was described above as a nonlimitative example. Diverse variants of implementation, notably employing more than three infrared emission diodes, can be implemented without going beyond the scope of the invention.

Examples of applications of devices according to aspects of the invention include, in particular, but are not limited to the following:

Nanomovement control devices for piezo-actuator systems;

High-voltage, low-consumption relays for optoelectronic applications;

High-voltage bipolar stabilized feed;

Unipolar or bipolar amplifiers;

Plate polarization in a detector;

High-voltage operational amplifier; and

High-voltage photo-detector tube servo-systems.

What is claimed is:

1. A hybrid semiconductor circuit adjustable by a control signal for controlling voltage comprising:

a single high-voltage reversely polarized diode surrounded by at least two diodes emitting infrared radiation, said at least two diodes being fed in series by the control signal, and arranged to allow optical interaction with the high-voltage diode, wherein said at least two diodes are encapsulated with a coating resin having a high transmission rate in an infrared domain.

2. The hybrid circuit according to claim 1, wherein the at least two diodes are arranged transversely with respect to an emission axis that is radial in relation to a principal axis of the high-voltage diode.

3. The hybrid circuit according to claim 1, further comprising a coating comprising a material having reflective properties in the infrared domain.

4. The hybrid circuit according to claim 1, wherein the at least two diodes emit a radiation of about 880 manometers.

5. The hybrid circuit according to claim 1, wherein the optical index of the coating resin is substantially identical to the optical index of the at least two diodes.

6. The hybrid circuit according to claim 1, wherein the coating contains a titanium oxide-based material.

7. A high-voltage amplifier comprising:

a hybrid semiconductor circuit adjustable by a control signal for controlling voltage comprising a single high-voltage reversely polarized diode surrounded by at least two diodes emitting infrared radiation fed in series by the control signal and arranged to allow optical interaction with the high-voltage diode, wherein said diodes are encapsulated with a coating resin having a high transmission rate in an infrared domain, wherein the high-voltage amplifier is controlled by an input signal feeding the at least two diodes and delivering an output signal controlled by the high-voltage diode fed by a reverse current.

8. A high-voltage adjustable feed comprising:

a hybrid semiconductor circuit adjustable by a control signal for controlling voltage comprising a single high-voltage reversely polarized diode surrounded by at least two diodes emitting infrared radiation fed in series by the control signal and arranged to allow optical interaction with the high-voltage diode, wherein said diodes are encapsulated with a coating resin having a high transmission rate in an infrared domain, wherein the high-voltage adjustable feed is controlled by an adjustable signal feeding the at least two diodes and delivering an output signal controlled by the high-voltage diode fed by a reverse current.

* * * * *